United States Patent [19]

Graham et al.

[11] Patent Number: 4,841,232

[45] Date of Patent: Jun. 20, 1989

[54] METHOD AND APPARATUS FOR TESTING THREE STATE DRIVERS

[75] Inventors: Patricia K. Graham; Robert R. Williams, both of Rochester, Minn.

[73] Assignee: International Business Machines Corporation, Armonk, N.Y.

[21] Appl. No.: 187,703

[22] Filed: Apr. 29, 1988

[51] Int. Cl.$^4$ .................................. G01R 31/28
[52] U.S. Cl. .......................... 324/73 R; 371/20
[58] Field of Search .............. 324/73 R, 158 R; 371/15, 16, 20

[56] References Cited

U.S. PATENT DOCUMENTS

| | | | |
|---|---|---|---|
| 3,849,726 | 11/1974 | Justice | 324/73 R |
| 4,236,246 | 11/1980 | Skilling | 324/73 R |
| 4,242,751 | 12/1980 | Henckels et al. | 324/73 R |
| 4,459,693 | 7/1984 | Prang et al. | 371/20 |
| 4,475,195 | 10/1984 | Carey | 371/20 |
| 4,490,673 | 12/1984 | Blum et al. | 324/73 R |
| 4,528,505 | 7/1985 | Peterson | 324/158 R |

Primary Examiner—Ernest F. Karlsen
Attorney, Agent, or Firm—Bradley A. Forrest

[57] ABSTRACT

In an integrated circuit chip utilizing CMOS technology, an embedded data bus is driven by embedded three state drivers, and the bus is in turn connected to provide a drive signal to embedded receivers and similar logic devices. An embedded threshold detector is provided to detect the occurrence of any invalid data signal (i.e. a non-"0" or a non-"1" signal level) on the data bus. The threshold detector's output signal is connected to off chip terminal means, to thereby enable off chip monitoring of the bus signal. The threshold detector's output signal is also ANDed with the bus signal, to thereby prevent the application of a potentially destructive invalid bus signal to the receivers and the like. Terminator circuit means provides a known invalid signal state on the bus when the bus is in its high impedance state due to all of the three state drivers being disabled.

28 Claims, 3 Drawing Sheets

METHOD AND APPARATUS FOR TESTING THREE STATE DRIVERS

DESCRIPTION

FIELD OF THE INVENTION

This invention relates to the field of integrated circuit testing, and more specifically to a method and an apparatus for testing embedded three state drivers, three state busses, and associated logic means.

BACKGROUND OF THE INVENTION

The present invention relates to three state gates or drivers, and more specifically to the testing of such three state drivers (TSD) and associated circuit means.

A TSD is a binary gate that includes a data input, a data output, and an enable input. When the TSD is enabled, its output is in a low impedance state, and the binary signal then present on its input appears at its output. Thus an enabled TSD's output can be at one of two logic states, i.e. a binary "1" or a binary "0", depending upon the state of the input signal. The enabled state of a TSD is called its active state.

When the TSD is not enabled, its output is in a high impedance state (H state). In the H state, the TSD effectively disconnects itself from the circuit to which it is connected in its active state, to drive with a logical "1" or a logical "0". In the H state, the output of the TSD must appear as an open circuit, neither attempting to charge nor discharge the circuit to which its output is physically connected (sometimes called the fanout of the bus).

A common use of TSDs is to selectively connect only one of a number of logical devices to a bus, net or wire that is shared by all of the logical devices. More specifically, the one device that is to be connected to the bus has its TSD enabled, as the TSDs of all other devices are disabled. Since all disabled TSDs are, or should be, in their high impedance state, the bus receives or transmits binary data only from the one logical device.

The H state of TSDs has challenged skilled practitioners to provide adequate and reliable means to test the operation of TSDs within the framework of the logic-oriented systems to which the TSDs are connected. Typically, it was necessary to consider this H state as a "don't care" or "unknown" state during testing. Thus, this condition of the embedded TSD busses was generally not tested in the prior art, and it was difficult for the logical designer to verify that a logic design was operating or would operate as intended.

The present invention relates to the testing of embedded three state logic circuitry.

This invention finds utility where a three state bus is embedded on a chip, as well as in other embedded arrangements, such as, for example, where three state busses, while not embedded in an integrated circuit chip per se, connect from one chip to another chip on a multiple chip carrier, where the busses are not brought out of, or off of, the carrier for testing.

Arrangements for testing integrated circuits are known in the art.

For example, U.S. Pat. No. 4,528,505 describes an arrangement whereby a test transistor may be provided on every IC, and wherein the threshold voltage of this transistor is calculated, based upon its measured gate-to-source voltage for two different drain-to-source current values. In this way, ICs are screened to determine which are likely to fail at high and low temperatures, due to threshold voltage sensitivities.

Arrangements for testing busses are also known. Some examples are as follows.

U.S. Pat. No. 3,849,726 discloses an arrangement for testing an interface line. In the line-drive-test mode of operation, a binary "1" or "0" signal of programmed value is applied to the interface line, and thereby to the unit under test. In the line-response-test mode of operation, a programmable loading circuit sets up loading conditions for the interface line that are necessary to evaluate the quality of the unit under test. In this response-test mode, a comparator circuit is provided to evaluate an expected logical "1" or logical "0" received from the interface line, by comparing the magnitude of these logical interface line signals to reference values.

U.S. Pat. No. 4,236,246 teaches an arrangement for detecting and locating faults in electronic components, such as tri-state components, that are interconnected by nodes. The nodes are driven by voltage signals that corresponded to the high and low logic states of the components, and to a third state that should exist when the nodes are disconnected from the components. Comparators operate to compare (1) the mode's actual response to these signals, to (2) signals which represent the mode's expected response to these signals. An error signal is generated when the node's actual response does not compare to the expected response.

U.S. Pat. No. 4,459,693 describes an arrangement for diagnosing failure on tri-state bus nodes. If failure is detected, the component causing the failure is identified. More specifically, all components connected to the bus nodes are first disabled. High and low reference voltages are then connected to each bus node through resistors. Measurements are made to determine if the mode voltage can be controlled by these voltages and these resistors. If "yes", normal component test proceeds. If "no", a procedure to locate the failing component begins. In this failure locating procedure, the components are sequentially enabled, one by one, to locate the component whose enablement does not appreciably change the test measurement. That component is then identified as the failing component.

U.S. Pat. No. 4,490,673 describes an arrangement for testing an integrated circuit containing a tri-state driver, where the driver and its control signal generator (i.e. the network whose output determines whether the driver will operate in its active or in its high impedance mode of operation) are on the same integrated circuit chip. In this arrangement, the driver is first forced to its high impedance state, and its output is checked to assure that the driver has properly reached this state. The driver is then forced to its active state, independent of the output of the control signal generator. A test pattern is then applied to the control signal generator. Since the driver is now held active, the driver's output is at all times a measure of the response of the control signal generator to the test pattern.

While these arrangements have provided some measure of reliable testing, they did not provide a construction and arrangement that enabled reliable testing of embedded three state busses, or reliable testing of the high impedance state of three state busses.

SUMMARY OF THE INVENTION

The present invention provides a method and apparatus for the reliable testing of integrated circuit chips in which three state drivers, data busses and data receivers are embedded in the structural architecture of the chip or a chip carrier, where the busses are not available for testing by means of test probes and the like.

The invention not only provides for the testing of faults related to the active state of a TSD-driven data bus, but also facilitates testing for faults that are associated with TSDs that are stuck in the high impedance state (the H state), as well those associated with orthogonal fault conditions. Under such fault conditions, the signal level on the TSD-driven bus will not be in a valid logic level, and detector means provided by the invention detects the presence of such an invalid logic level on the bus.

As used herein, the term valid signal level refers to a predefined, usually narrow range, of voltage levels, which when of a low range of magnitudes define a logical "0", and which when of a higher range of magnitudes define a logical "1". When the signal level is not within one of these two magnitude ranges, the signal is defined as an invalid signal. When a test pattern should produce a predefined output signal, and said predefined output signal is not in fact produced, a failure has occurred or a fault has been detected.

The invention utilizes a thresholding circuit that outputs a different signal level when the circuit's input (i.e. the bus's signal level) is at a valid logic level than it does when its input is at an invalid level. The invention may be implemented in the technology of any circuit family, so long as a thresholding circuit can be designed that will respond differently to valid and invalid levels for that circuit family.

More specifically, the invention provides embedded threshold detector means that provides a signal at one binary level when the data signal on the data bus is within acceptable limits, and provides a signal at the other binary level when the bus's data signal is not acceptable.

In order to ensure that the threshold detector circuit functions properly for the detection of either the H state or for the detection of three state orthogonal conflicts, a terminator means is provided for the bus. When all TSDs are disabled, thus placing the bus in the H state, this terminator means operates to ensure that a known signal level that is neither a "0" nor a "1" (i.e. the known signal level is of an invalid signal level) is placed on the bus. This known invalid signal level can therefore be reliably detected as a faulty signal by the threshold detector.

Within the teachings of this invention, such a terminator means comprises any construction and arrangement that operates to cause the TSD-driven bus to quickly seek this known invalid signal level as soon as the bus is placed in its H state. However, such a terminator means must allow the bus to achieve a valid "0" or "1" signal level when a TSD is enabled.

For example, assume that a three state bus currently resides at a valid "0" state, due to enablement of one of its TSDs. Now assume that this TSD is disabled, thereby placing the bus in its H state. The terminator means of the present invention now operates to source current to the bus, causing the signal on the bus to increase to a signal level that is neither a "0" nor a "1". On the other hand, if the bus had been at the "1" signal level prior to being placed in its H state, the terminator means of the invention would have operated to sink current from the bus, again causing the bus to assume an invalid signal level.

Thus, in a preferred embodiment, the terminator means of the invention selectively operates as a source or a sink, as is necessary to insure that the H-state bus seeks an invalid signal level.

When such a terminator means is not present, the exact voltage level of the bus when in the H state cannot be ensured, and thus detection of the non "0" or "1" voltage level by the threshold detector cannot be ensured. This is due to the fact that the H state bus can in fact be at a valid residual level, this residual level relating to a preexisting state of the bus.

When the bus is in an orthogonal state, with one or more TSDs simultaneously attempting to discharge the bus, as one or more TSDs simultaneously attempt to charge the bus, the multiple TSDs that are connected to the bus can be structured so that the bus is driven to a voltage that is known to be of neither the valid "0" or "1" range. Thus, this orthogonal bus state can be reliably detected by the threshold detector.

As a further feature of the invention, embedded gating means are provided to inhibit transmission of potentially destructive bus data signals to the receiver means so long as the output of the threshold detector means is at a binary level indicating that the bus signal is not within acceptable valid limits.

As yet another feature of the invention, the binary output of said threshold detector means is connected to off chip terminal means, thus enabling off chip monitoring of the data bus signal, and the like. For example, during the testing of integrated circuit chips as they are manufactured, test signals may be applied to the chip, and the proper response of the bus signal may be monitored.

In a preferred embodiment of the inventor the embedded circuit means of the invention is constructed using CMOS technology.

These and other features of the invention will be apparent from the following description of preferred embodiments thereof.

THE INVENTION

Figure 1:
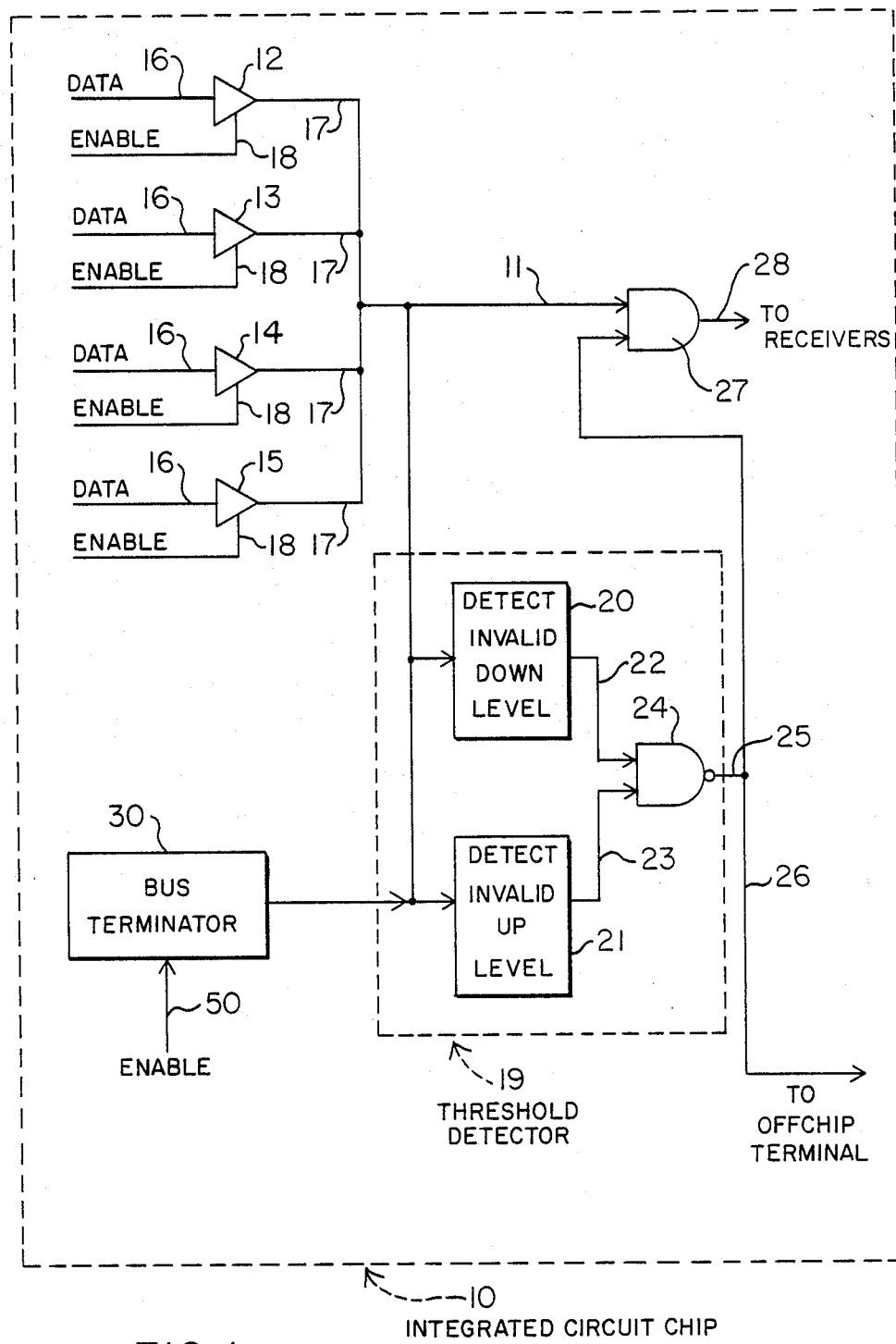
FIG. 1 shows a first embodiment of the invention.

FIG. 1 is a showing of a first embodiment of the invention. In this embodiment, reference numeral 10 designates a VLSI circuit chip of any detailed construction and circuit arrangement. Whatever the detailed construction and arrangement of chip 10, the chip includes at least one embedded bus or wire 11 to which a plurality of TSDs 12-15 and logic receivers (not shown) are connected.

Each of the drivers 12-15 includes a data input, all of which are numbered 16, a data output, all of which are numbered 17, and an enable input, all of which are numbered 18.

The outputs 17 of all drivers are connected to bus 11. As is well known, when a particular input data signal is to be transmitted to an embedded chip receiver circuit(s), the TSD associated with that input data signal is enabled, thus placing that TSD in its active state. At the same time, the other TSDs are disabled, causing these TSDs to assume their high impedance states (H). In this way, the selected input data signal is placed on bus 11. Depending upon the binary state of this signal, bus 11 is either charged as current flows from the TSD into the bus, or the bus is discharged as current flows from the bus into the TSD.

The construction and arrangement of the invention provides a threshold detector 19 for at least one of the embedded busses 11 that reside within the structure of chip 10. Chip 10 will usually include a number of such busses 11, and the technique of the present invention is applied to the majority, and probably all, of the embedded busses 11.

Threshold detector 19 of the present invention provides for reliable testing for valid signals on bus 11, and for orthogonal states of bus 11. With the additional feature of bus terminator 30, detector 19 also provides for the reliable testing of the H state of bus 11. In operation in a machine, the H state may be acceptable, however, the orthogonal state is usually not acceptable. The orthogonal state may be made acceptable if only protected logic devices are connected to be driven by bus 11. This orthogonal state is defined as a state in which one or more active TSDs are attempting to drive the bus to a low logic level, as one or more other active ISDs are attempting to drive the bus to a high logic level.

Many faults or defects may be associated with or detected through the individual TSDs 12–15 that supply a signal to bus 11. Some of these faults are characterized as tuck faults, i.e., points of failure which maintain a consistent down level ("φ") or up level ("1") in spite of opposing stimulus. In the presence of a stuck fault anywhere in the design, an individual driver can be stuck (1) in the active state in which it provides a down level logic signal ("φ") to bus 11, (2) in the active state in which it provides an up level logic signal ("1") to bus 11, (3) in its high impedance inactive state (H) in which it provides a high impedance to bus 11, or (4) in a self-conflicting state in which it provides an orthogonal signal to bus 11 which is caused by its two distinct driver components, one of which provides the down level pull, and the other of which provides the up level pull, both being active simultaneously.

These stuck conditions of the TSD can be due to failures within the TSD itself, as is always the case with condition (4), or due to faults in the logic driving either the TSD's data input 16 or its enable input 18. Depending on the defect and its physical position in the design, the stuck condition of the TSD may or may not be pattern dependent. For example, if enable input 18 to the TSD is stuck inactive, the TSD will always be at the high impedance state (H) regardless of pattern input. If, however, enable input 18 is stuck active, the TSD will always be active, but the state being driven is dependent on the level of data input 16.

Orthogonal states are not recommended in actual operation. However, intentionally generating an orthogonal condition is sometimes allowed where protected logic devices are connected to the bus.

Where faulty logic is driving the TSD enable input(s) 18, or where one or more TSD is faulty, orthogonality may occur. The present invention allows this condition to be detected, as it might occur during testing or in operation in either a good or a faulty machine.

In the construction and arrangement of the invention, threshold detector 19 includes a first detector means 20 that operates to detect an invalid down ("0" or low) level logic signal on bus 11, and a second detector means 21 that operates to detect an invalid up ("1" or high) level logic signal on bus 11. Detector means 20–21 are signal magnitude responsive devices.

Within the teachings of this invention, detector means 20,21 are constructed and arranged to provide a signal of a defined binary state on output conductors 22 or 23 whenever the signal present on bus 11 is not of a valid down level or of a valid up level, respectively.

For example, a binary "0" signal on conductor 22 indicates that the signal on bus 11 is of a valid down level, whereas a binary "0" signal on conductor 23 indicates that the signal on bus 11 is f a valid up level. As a result, so long as the signal on bus 11 is within acceptable high or low limits, the signal on either conductor 22 or conductor 23 is a binary "0".

The signals on conductors 22 and 23 are applied as inputs to NAND 24. Thus, output 25 of NAND 24 is a binary "1" so long as the signal present on bus 11 is of a valid magnitude.

A feature of the invention provides output signal 25 of NAND 24 to external chip terminal means (not shown) by way of conductor 26. This feature provides a means for externally sensing the state of the signal present on bus 11.

The signal on bus 11 can be directly applied to on chip receivers, or other on chip logic networks. However, a feature of the invention provides AND gate 27 at which the signal presented to bus 11 by a TSD(s) is anded with the output of NAND 24. This construction and arrangement prevents unknown, and thus potentially destructive, logic states from appearing on bus portion 28.

Since the output of NAND 24 is "1" only when the output of either detector means 20 or detector means 21 is "0" (the "0"-"0" input state for NAND 24 is not possible except in a faulty machine), the signal on bus 11 is gated to bus portion 28, and to the chip's various receivers and other logic networks, only when a valid signal is present on bus 11. This feature of the invention ensures that a bus voltage that does not definitely define a "0" or a "1" cannot be presented to the various embedded logic means to which bus portion 28 is connected. The use of AND gate 27 has special utility during self test.

The use of AND 27 removes signal level uncertainty from bus portion 28, when, for example, pseudo random test patterns that are applied to the TSDs are operable to produce orthogonal TSD drive conditions on bus 11, as well as when all TSDs that drive the bus are placed in their H state.

Yet another feature of the invention provides a bus terminator means 30 for threshold detector 19. Enable input 50 of the terminator means is active during testing, in order to ensure that threshold detector 19 will provide a "0" output signal on conductor 25 when TSDs 12–15 are all in their H state.

The H state of bus 11, in the absence of terminator means 30, must be considered to be a "don't care" state, since the logic level of the bus can be of any value, including a valid level, due to residual signal effects that may be left over from a previous logic level that existed on the bus.

Terminator 30, when enabled, provides a terminating sink/source impedance for bus 11 to ensure that the bus will assume a logic level that is an invalid level (i.e. not a "1" or a "0") when all TSDs are in their high impedance state.

However, should any TSD be in its active state, terminator 30 will have no effect on the resulting logic level of bus 11, and the logic level of the bus in this case will be determined by the enabled TSD.

In use, the H state of bus 11 may not be monitored. Within the teachings of the invention, bus terminator 30 may be continuously operative, terminator 30 may be rendered inoperative once chip 10 has been tested, or terminator 30 may be periodically rendered operative during use. When terminator 30 is inoperative, detector 19 remains operative to detect orthogonal bus states, which states will normally occur only in a faulty machine.

While the invention finds utility in a chip 10 that is manufactured using any one of a variety of well known integrated circuit manufacturing technologies, MOS technology for chip 10 is preferred. For example, use of CMOS technology provides for VLSI logic functions with very low power dissipation.

Figure 2:
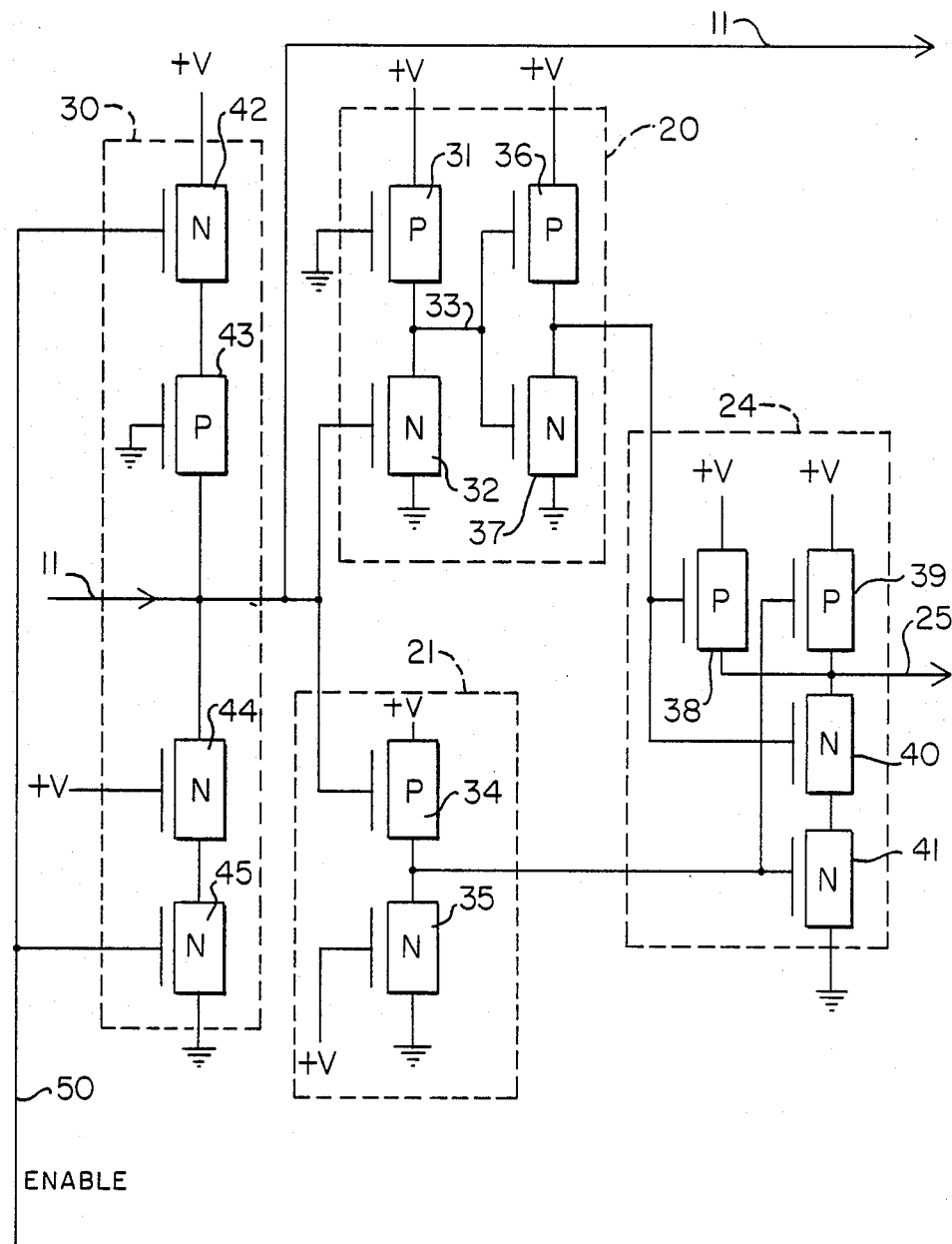
FIG. 2 shows an embodiment of the invention implemented in CMOS circuit technology.

FIG. 2 shows portions 20, 21, 24 and 30 of FIG. 1 implemented by the use of CMOS transistors. In FIG. 2, certain of the common elements retain the numerals that were used in FIG. 1. The designations "P" and "N" of FIG. 2 indicate that the CMOS transistors are P-channel and N-channel transistors, respectively.

Transistors 31 and 32 operate to detect the occurrence of an invalid low, "0", or down level, signal on bus 11. The reference signal means that enables detection of an invalid low level signal (i.e. the signal magnitude on bus 11 that will be indicated as invalid bus signals) is determined by the channel physical dimensions of these transistors. For example, if the channel width-to-length ratio of transistor 32 is large as compared to the width-to-length ratio of transistor 31's channel, then a bus signal of about one volt is all that is needed to make ratioed network 31,32 switch, and thereby provide a logical "0" signal at its output 33. Such an output signal is indicative of a invalid bus "φ" signal.

Similarly, transistors 34 and 35 operate to detect transistors 34 and 35 operate to detect the occurrence of an invalid high, "1", or up level, signal on bus 11. The channel of transistor 35 is of a physical size that carries only very small currents, and the physical width-to-length ratio of transistor 34's channel is designed accordingly, to thereby allow this ratioed network 34,35 to detect valid up levels of the signal on bus 11.

Transistors 36 and 37 comprise an invertor. This invertor is necessary to invert signal 33 as is necessary to drive NAND 24.

NAND 24 is made up of transistors 38–41. The output 25 of NAND 24 is high, i.e. a logical "1", when the signal on bus 11 is neither at an invalid high magnitude, nor at an invalid low magnitude. As stated relative FIG. 1, so long as the signal on conductor 25 is a logical "1", AND 27 of FIG. 1 is enabled, and a logical "1" signal is supplied to external circuit means by way of conductor 26.

Transistors 42–45 comprise bus terminator means 30 of FIG. 1. Terminator 30 operates to provide a reliable invalid H state voltage for bus 11. Thus, an invalid H state voltage can be detected by the threshold detector.

The channels of transistors 42–45 are dimensioned such that with all TSDs disconnected from the bus, bus 11 is driven to a signal level that is neither a valid up level nor a valid down level. More specifically, this invalid signal level is at a level that is intermediate the ground an +V potential levels. So long as terminator 30 is enabled (by conductor 50), transistors 42–45 will conduct current as a voltage divider, selectively charging or discharging bus 11 to a level that is neither a "1" nor a "0", regardless of the previous state of bus 11 (assuming of course that a TSD is not stuck in its active state).

Terminator 30 provides a slight, though constant, current drain. If the H state is never expected in use, it may be preferred to disable the chip's terminator(s) 30 after the chip has been tested. Conductor 50 allows terminator 30 to be selectively enabled or disabled.

In the orthogonal state of bus 11, it is known that the voltage on bus will reliably not be at a valid "0" or a valid "1" state.

Figures 3, 4:
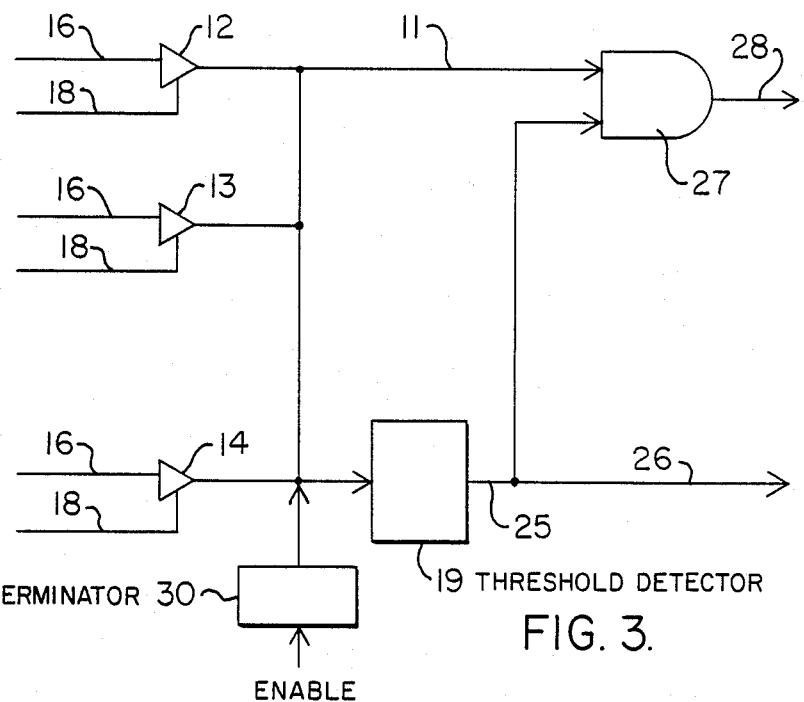
FIG. 3 is a figure much like FIG. 1, but shows three three state drivers connected to the data bus.
FIG. 4 is a table showing a number of representative test pattern signals that may be applied to the three state drivers of FIG. 3, and showing the expected output response to these test pattern signals.

FIG. 3 is an embodiment of the invention much like the embodiment of FIG. 1. In FIG. 3, three TSDs 12–14 are connected to drive bus 11. The signal on bus 11 is connected to both AND 27 and threshold detector 19. The output 25 of detector 19 is connected to AND 27 and to conductor 26 for off chip monitoring. Terminator means 30 provides a terminating impedance for the H state of bus 11.

The table of FIG. 4 shows six possible test pattern inputs that may be applied to the three data inputs 16 and to the three enable inputs 18 of TSDs 12–14. On the horizontal line associated with each of the six numbered test patterns, the resulting signals on bus 11, conductor 25 and bus portion 28 are shown.

With reference to test pattern number 1, since the enable inputs 18 of all three TSDs are at a "0" level, all TSDs are disabled, and the signal on H state bus 11 is of a magnitude established by terminator 30. Due to the operation of terminator 30, this bus signal is reliably recognized as an invalid signal by detector 19, and its output 25 is thus "0". Since AND 27 is inhibited by the signal on conductor 25, the signal on bus portion 28 is "0". The presence of a "0" on both conductor 26 and conductor 28 indicates that the TSDs apparently responded properly to the three disable signals 18.

The test patterns numbered 2 and 3 test the ability of the three state bus system to respond to (1) only TSD 12 enabled, and with "0" on its data-input 16, see pattern number 2; and (2) only TSD 12 enabled, and with "1" on its data input 16, see pattern number 3. In both cases, a "1" appears on conductor 25, indicating that the three state bus system responded properly, and the TSDs data input signal appeared on conductor 28, as it should have.

Pattern 4 represents a test condition in which the test pattern produces a nonstandard condition on the bus. Namely, both TSD 12 and TSD 13 are enabled, with both of the TSDs having a "0" on their data inputs 16. Since both of the TSDs are attempting to discharge bus 11, the condition is allowable, but is not recommended as a good machine pattern. Detector 19 provides a "1" at its output 26, thus allowing the discharged stat of bus 11 to propagate thru AND 27 as a "0". Note that this situation is similar to test pattern 2 but is much less effective as a test pattern.

While the condition of pattern 4 is nonstandard, the pattern is nondestructive of the logic means connected to bus portion 28, and pattern 4 is therefore not shielded from propagation by operation of AND 27.

Pattern number 5 induces a nonstandard orthogonal condition on bus 11 since both TSD 12 and TSD 13 are active, with TSD 12 attempting to charge bus 11, while TSD 13 is attempting to discharge the bus. This reliably produces an invalid signal on the bus, and a "0" output from detector 19. As a result, the signal on conductor 28 is "0". This pattern is not recommended in a good machine, and thus should generally occur only under test or fault conditions.

Pattern 6, like pattern 5, is a nonstandard three state conflict condition. Here, all three TSDs are enabled. TSD 12 is attempting to charge the bus, and TSDs 13 and 14 are attempting to discharge the bus. TSDs 12–14 are balanced such that with the condition of pattern 6, bus 11 does not assume a "1" or a "0" state. This reliably produces an invalid signal on bus 11, and a "0" on conductor 28.

In accordance with a feature of the invention, AND 27 isolates potentially destructive nonstandard signal conditions that are produced on bus 11, for example by test patterns such as 5 and 6, from the chip's embedded logic means (not shown) that is connected to bus portion 28.

In the above manner, various TSD data/enable test patterns may be applied to the TSDs that drive bus 11, and the three state bus is tested by comparing the output that should result to the output that actually does occur.

While the present invention has been described with reference to preferred embodiments thereof, those skilled in the art will be aware of other constructions and arrangements in which the invention finds utility. Thus, the scope and content of the invention are not to be limited by the scope and content of the above description, but rather are to be determined by the following claims.

We claim as our invention:

1. In a circuit having a data bus, the improvement comprising,
   data driver means having a data input, a data output and an enable input,
   means connecting the data output of said data driver means to said data bus, to thereby drive said data bus with a binary signal when said data driver means is enabled, or to present a high impedance to said data bus when said data driver means is disabled,
   receiver means connected to said data bus, and
   test means connected to said data bus operable to provide an output signal of one state that is indicative of a valid binary signal on said bus when said data driver means is enabled, and an output signal of an opposite state that is indicative of an invalid binary signal on said bus when said data driver means is disabled.

2. The circuit of claim 1 wherein said test means provides an output signal of said opposite state that is indicative of an invalid binary signal on said data bus when said data driver means is in an orthogonal enabled state.

3. The circuit of claim 2 wherein said data bus, said data driver means, said test means, and said receiver means are embedded in an integrated circuit means.

4. The circuit of claim 2, wherein said test means includes threshold means operable to detect valid or invalid binary signals on said data bus.

5. The circuit of claim 1 including terminator means connected to said data bus, operable to provide a termination for said bus when said data driver means is disabled, to thereby ensure that said data bus is forced to an invalid binary signal when said data driver means is disabled.

6. The circuit of claim 2 including terminator means connected to said data bus, operable to provide a current termination for said bus when said data driver means is disabled, to thereby ensure that said data bus is forced to an invalid binary signal when said data driver means is disabled.

7. The circuit of claim 1, including gating means combining the output signal from said testing means with the signal on said data bus in a manner to inhibit said data bus signal from being received by said receiver means in the presence of an output signal of said opposite state from said test means.

8. The circuit of claim 2, including means anding the output signal from said testing means with the signal on said data bus, to inhibit a potentially destructive invalid binary bus signals from being received by said receiver means.

9. In the circuit of claim 3, means combining the output signal of said testing means with the signal on said data bus in a manner to inhibit said data bus signal from being received by said receiver means in the absence of an output signal of said one state.

10. In the circuit of claim 4, means combining the output signal from said testing means with a signal present on said data bus in such a manner as to inhibit a potentially destructive invalid binary bus signal from being received by said receiver means.

11. In an integrated circuit having an embedded data bus, the improvement comprising, a plurality of three state data drivers, each having a data input, a data output and an enable input,
   means connecting the data output of all data drivers to said data bus, to thereby drive said data bus with a binary signal when one of said data drivers is enabled, or to present a high impedance to said data bus when all of said data drivers are disabled,
   receiver means connected to said data bus, and
   test means connected to said data bus operable to provide an output signal of one state that is indicative of a valid binary signal on said bus when one of said data drivers is enabled, and an output signal of an opposite state that is indicative of an invalid binary signal on said bus is placed in an H state by all of said data drivers being disabled.

12. The circuit of claim 11 wherein said test means provides an output signal of said opposite state that is indicative of an invalid binary signal on said data bus when said data drivers are in orthogonal enabled states.

13. The circuit of claim 12 wherein said data drivers, said test means, and said receiver means are embedded said integrated circuit.

14. The circuit of claim 12, wherein said test means includes threshold means operable to detect valid or invalid binary signals on said data bus.

15. The circuit of claim 11 including sink/source terminator means connected to said data bus, operable to provide a termination for said bus when all of said data drivers are disabled, to thereby ensure that said data bus is forced to an invalid binary signal when in said H state.

16. The circuit of claim 12 including terminator means connected to said data bus, operable to provide a current termination for said bus when all of said data drivers are disabled, to thereby ensure that said data bus is forced to an invalid binary signal when all of said data drivers are disabled.

17. The circuit of claim 11, including gating means combining the output signal from said testing means with the signal on said data bus in a manner to inhibit said data bus signal from being received by said receiver means in the presence of an output signal of said opposite state from said test means.

18. The circuit of claim 12, including means anding the output signal from said testing means with the signal on said data bus, to inhibit a potentially destructive invalid binary bus signals from being received by said receiver means.

19. In the circuit of claim 13, means combining the output signal of said testing means with the signal on said data bus in a manner to inhibit said data bus signal from being received by said receiver means in the absence of an output signal of said one state.

20. In the circuit of claim 14, means combining the output signal from said testing means with a signal present on said data bus in such a manner as to inhibit a potentially destructive invalid binary bus signal from being received by said receiver means.

21. A method for testing integrated circuit chip means having a data bus connected to selectively receive data from three state driver means, and to apply said data to receiver means, comprising,
providing three state data driver means having data input means, data output means and enable input means,
connecting the data output means of said data driver means to said data bus, to thereby drive said data bus with a binary signal when enabled, or to present a high impedance to said data bus when disabled,
connecting receiver means to said data bus, and
connecting test means to said data bus, said test means being operable to provide an output signal of one state indicative of the presence of a valid data signal on said bus when one of said driver means is enabled, and of an opposite state indicative of an invalid data signal on said bus when said data driver means are disabled.

22. The method of claim 21 wherein said data bus, said driver means and said receiver means are embedded within the structure of said chip means.

23. The method of claim 21, including the step of providing threshold means operable to establish reference levels for detecting said valid data signal.

24. The method claim 22 including the step of providing sink/source terminating means operable to force said data bus to an invalid data signal when said data driver means is in said disabled state.

25. In method of claim 21, including the step of combining the output signal of said testing means with the signal on said data bus in a manner to inhibit said data bus signal from being received by said receiver means in the absence of an output signal of said first state from said testing means.

26. The method of claim 21, including the step of combining the output signal of said testing means with the signal on said data bus in a manner to inhibit said data bus signal from being received by said receiver means in the presence of an signal of said second state from said testing means.

27. The method of claim 22, wherein an invalid data signal is potentially destructive of said receiver means, and including the step of combining the output signal of said testing means with a signal present on said data bus in a manner to inhibit said an invalid bus signal from being received by said receiver means.

28. The method of claim 24, including the step of combining the output signal of said testing means with a signal present on said data bus in a manner to inhibit a potentially destructive data bus signal from being received by said receiver means.

* * * * *